(12) United States Patent
Drogi et al.

(10) Patent No.: US 11,223,325 B2
(45) Date of Patent: Jan. 11, 2022

(54) MULTI-LEVEL ENVELOPE TRACKING SYSTEMS WITH ADJUSTED VOLTAGE STEPS

(71) Applicant: Skyworks Solutions, Inc., Irvine, CA (US)

(72) Inventors: Serge Francois Drogi, Flagstaff, AZ (US); Florinel G. Balteanu, Irvine, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 0 days.

(21) Appl. No.: 16/948,550

(22) Filed: Sep. 23, 2020

(65) Prior Publication Data

US 2021/0099137 A1 Apr. 1, 2021

Related U.S. Application Data

(60) Provisional application No. 62/906,932, filed on Sep. 27, 2019.

(51) Int. Cl.
| | |
|---|---|
| *H03F 1/30* | (2006.01) |
| *H03F 1/02* | (2006.01) |
| *H03F 3/24* | (2006.01) |
| *H03F 3/195* | (2006.01) |

(52) U.S. Cl.
CPC ........... *H03F 1/0227* (2013.01); *H03F 3/195* (2013.01); *H03F 3/245* (2013.01); *H03F 2200/102* (2013.01); *H03F 2200/171* (2013.01); *H03F 2200/336* (2013.01); *H03F 2200/451* (2013.01)

(58) Field of Classification Search
CPC .................................... H03F 1/30; H03F 3/20
USPC ......................................... 330/129, 136, 297
See application file for complete search history.

(56) References Cited

U.S. PATENT DOCUMENTS

| | | |
|---|---|---|
| 6,438,365 B1 | 8/2002 | Balteanu |
| 6,704,560 B1 | 3/2004 | Balteanu et al. |
| 6,977,976 B1 | 12/2005 | Birkett et al. |
| 7,496,339 B2 | 2/2009 | Balteanu et al. |
| 8,140,028 B2 | 3/2012 | Balteanu et al. |

(Continued)

OTHER PUBLICATIONS

International Search Report and Written Opinion for International Application No. PCT/US2020/052319 dated Jan. 12, 2021 in 7 pages.

*Primary Examiner* — Henry Choe
(74) *Attorney, Agent, or Firm* — Knobbe, Martens, Olson & Bear, LLP

(57) ABSTRACT

Multi-level envelope tracking systems with adjusted voltage steps are provided. In certain embodiments, an envelope tracking system for generating a power amplifier supply voltage for a power amplifier is provided. The envelope tracking system includes a multi-level supply (MLS) DC-to-DC converter that outputs multiple regulated voltages, an MLS modulator that controls selection of the regulated voltages over time based on an envelope signal corresponding to an envelope of a radio frequency (RF) signal amplified by the power amplifier, and a modulator output filter coupled between an output of the MLS modulator and the power amplifier supply voltage. The envelope tracking system further includes a switching point adaptation circuit configured to control the voltage level of the regulated voltages outputted by the MLS DC-to-DC converter based on a power level of the RF signal.

20 Claims, 11 Drawing Sheets

(56) References Cited

U.S. PATENT DOCUMENTS

| | | |
|---|---|---|
| 8,351,873 B2 | 1/2013 | Balteanu et al. |
| 8,718,188 B2 | 5/2014 | Balteanu et al. |
| 8,786,371 B2 | 7/2014 | Popplewell et al. |
| 8,981,847 B2 | 3/2015 | Balteanu |
| 9,083,455 B2 | 7/2015 | Popplewell et al. |
| 9,092,393 B2 | 7/2015 | Whitefield et al. |
| 9,118,277 B2 | 8/2015 | Balteanu et al. |
| 9,143,096 B2 | 9/2015 | Balteanu et al. |
| 9,189,430 B2 | 11/2015 | Ross et al. |
| 9,197,128 B2 | 11/2015 | Popplewell et al. |
| 9,294,054 B2 | 3/2016 | Balteanu et al. |
| 9,391,648 B2 | 7/2016 | Popplewell et al. |
| 9,425,833 B2 | 8/2016 | Popplewell et al. |
| 9,445,371 B2 | 9/2016 | Khesbak et al. |
| 9,559,637 B2 | 1/2017 | Yang et al. |
| 9,584,070 B2 | 2/2017 | Balteanu et al. |
| 9,588,529 B2 | 3/2017 | Balteanu et al. |
| 9,606,947 B2 | 3/2017 | Ross et al. |
| 9,668,215 B2 | 5/2017 | Balteanu et al. |
| 9,673,707 B2 | 6/2017 | Popplewell et al. |
| 9,698,832 B2 | 7/2017 | Popplewell et al. |
| 9,774,300 B2 | 9/2017 | Jin et al. |
| 9,806,676 B2 | 10/2017 | Balteanu et al. |
| 9,831,834 B2 | 11/2017 | Balteanu et al. |
| 9,876,473 B2 | 1/2018 | Khesbak et al. |
| 9,893,682 B2 | 2/2018 | Zhu et al. |
| 9,935,582 B2 | 4/2018 | Balteanu et al. |
| 9,948,241 B2 | 4/2018 | Popplewell et al. |
| 9,971,377 B2 | 5/2018 | Balteanu et al. |
| 9,973,088 B2 | 5/2018 | Balteanu et al. |
| 9,990,322 B2 | 6/2018 | Whitefield et al. |
| 9,991,856 B2 | 6/2018 | Khesbak et al. |
| 10,080,192 B2 * | 9/2018 | Balteanu .................. H03F 3/245 |
| 2015/0194988 A1 | 7/2015 | Yan et al. |
| 2016/0094186 A1 | 3/2016 | Cohen |
| 2017/0131734 A1 | 5/2017 | Balteanu et al. |
| 2017/0195972 A1 | 7/2017 | Drogi et al. |
| 2017/0223632 A1 * | 8/2017 | Balteanu .................. H03F 1/02 |
| 2017/0228332 A1 | 8/2017 | Ross et al. |
| 2017/0338773 A1 | 11/2017 | Balteanu et al. |
| 2018/0076772 A1 | 3/2018 | Khesbak et al. |
| 2018/0138862 A1 | 5/2018 | Balteanu et al. |
| 2018/0152945 A1 | 5/2018 | Balteanu |
| 2018/0159476 A1 | 6/2018 | Balteanu et al. |
| 2018/0159478 A1 | 6/2018 | Balteanu et al. |
| 2018/0167037 A1 | 6/2018 | Zhu et al. |
| 2018/0234095 A1 | 8/2018 | Balteanu et al. |
| 2018/0278214 A1 | 9/2018 | Jin et al. |
| 2018/0287573 A1 | 10/2018 | Khesbak et al. |
| 2018/0294776 A1 | 10/2018 | Popplewell et al. |
| 2018/0302036 A1 | 10/2018 | Balteanu et al. |
| 2018/0309410 A1 | 10/2018 | Gatard et al. |
| 2018/0331659 A1 | 11/2018 | Khesbak et al. |
| 2018/0351454 A1 | 12/2018 | Khesbak et al. |
| 2018/0375476 A1 | 12/2018 | Balteanu et al. |
| 2018/0375483 A1 | 12/2018 | Balteanu et al. |
| 2019/0020315 A1 | 1/2019 | Khesbak et al. |
| 2019/0123690 A1 | 4/2019 | Balteanu et al. |
| 2019/0158046 A1 | 5/2019 | Lehtola et al. |
| 2019/0165736 A1 | 5/2019 | Khesbak et al. |
| 2019/0190462 A1 | 6/2019 | Zhu et al. |
| 2019/0229621 A1 | 7/2019 | Balteanu et al. |
| 2019/0341888 A1 | 11/2019 | Drogi et al. |
| 2019/0372526 A1 | 12/2019 | Balteanu et al. |
| 2019/0372628 A1 | 12/2019 | Balteanu et al. |
| 2019/0386617 A1 | 12/2019 | Naraine et al. |
| 2020/0067406 A1 | 2/2020 | Khesbak et al. |
| 2020/0099343 A1 | 3/2020 | Khesbak et al. |
| 2020/0112300 A1 | 4/2020 | Balteanu et al. |
| 2020/0127619 A1 | 4/2020 | Khesbak et al. |
| 2020/0154434 A1 | 5/2020 | Balteanu |
| 2020/0162028 A1 | 5/2020 | Balteanu et al. |
| 2020/0162030 A1 | 5/2020 | Drogi et al. |
| 2020/0259458 A1 | 8/2020 | Balteanu et al. |
| 2020/0259459 A1 | 8/2020 | Balteanu et al. |
| 2020/0336110 A1 | 10/2020 | Drogi et al. |
| 2020/0336122 A1 * | 10/2020 | Lin .......................... H04B 1/40 |
| 2020/0343865 A1 | 10/2020 | Balteanu et al. |
| 2021/0099135 A1 * | 4/2021 | Balteanu .................. H03F 3/195 |

* cited by examiner

MULTI-LEVEL ENVELOPE TRACKING SYSTEMS WITH ADJUSTED VOLTAGE STEPS

CROSS-REFERENCE TO RELATED APPLICATIONS

This application claims the benefit of priority under 35 U.S.C. § 119 of U.S. Provisional Patent Application No. 62/906,932, filed Sep. 27, 2019 and titled "MULTI-LEVEL ENVELOPE TRACKING SYSTEMS WITH ADJUSTED VOLTAGE STEPS," which is herein incorporated by reference in its entirety.

BACKGROUND

Field

Embodiments of the invention relate to electronic systems, and in particular, to power amplifiers for radio frequency (RF) electronics.

Description of the Related Technology

Power amplifiers are used in RF communication systems to amplify RF signals for transmission via antennas. It is important to manage the power of RF signal transmissions to prolong battery life and/or provide a suitable transmit power level.

Examples of RF communication systems with one or more power amplifiers include, but are not limited to, mobile phones, tablets, base stations, network access points, customer-premises equipment (CPE), laptops, and wearable electronics. For example, in wireless devices that communicate using a cellular standard, a wireless local area network (WLAN) standard, and/or any other suitable communication standard, a power amplifier can be used for RF signal amplification. An RF signal can have a frequency in the range of about 30 kHz to 300 GHz, such as in the range of about 410 MHz to about 7.125 GHz for fifth generation (5G) communications in frequency range 1 (FR1).

SUMMARY

In certain embodiments, the present disclosure relates to an envelope tracking system. The envelope tracking system includes a power amplifier configured to amplify a radio frequency signal and to receive power from a power amplifier supply voltage, and an envelope tracker configured to generate the power amplifier supply voltage based on an envelope signal corresponding to an envelope of the radio frequency signal. The envelope tracker includes a DC-to-DC converter configured to output a plurality of regulated voltages, a modulator configured to control the power amplifier supply voltage based on the plurality of regulated voltages and the envelope signal, and a switching point adaptation circuit configured to control a voltage level of at least one of the plurality of regulated voltages based on a power level of the radio frequency signal.

In some embodiments, the switching point adaptation circuit is configured to control the voltage level of each of the plurality of regulated voltages based on the power level of the radio frequency signal.

In various embodiments, the switching point adaptation circuit includes a power estimation circuit configured to estimate the power level of the radio frequency signal based on a signal power value for or at least one of a transmit frame or a transmit symbol. According to a number of embodiments, the signal power value indicates an average power for the transmit frame or symbol. In accordance with several embodiments, the signal power value indicates a peak power for the transmit frame or symbol. According to some embodiments, the switching point adaptation circuit further includes a voltage estimation circuit configured to estimate a plurality of desired voltage levels associated with the signal power value. In accordance with a number of embodiments, the switching point adaptation circuit further includes a programming circuit configured to control the DC-to-DC converter to output the plurality of regulated voltages each with a corresponding one of the plurality of desired voltage levels.

In several embodiments, the envelope tracking system further includes two or more power amplifiers configured to amplify two or more radio frequency signals, the envelope tracker including two or more modulators each configured to receive the plurality of regulated voltages and to provide modulation to generate a supply voltage for a corresponding one of the two or more power amplifiers. According to a number of embodiments, the switching point adaptation circuit is configured to control the voltage level based on a largest power level of the two or more radio frequency signals.

In several embodiments, the DC-to-DC converter is configured to receive a battery voltage, and to generate the plurality of regulated voltages based on providing DC-to-DC conversion of the battery voltage.

In some embodiments, each of the plurality of regulated voltages has a different voltage level.

In various embodiments, the envelope tracker further includes a plurality of decoupling capacitors each coupled between ground and a corresponding one of the plurality of regulated voltages.

In a number of embodiments, the modulator includes a plurality of switches each coupled between the modulator output voltage and a corresponding one of the plurality of regulated voltages.

In several embodiments, the envelope tracker further includes a modulator output filter connected between an output of the modulator and the power amplifier supply voltage, the modulator output filter including at least one series inductor and at least one shunt capacitor.

In certain embodiments, the present disclosure relates to a mobile device. The mobile device includes a transceiver configured to generate a radio frequency transmit signal, a front end circuit including a power amplifier configured to amplify the radio frequency transmit signal and to receive power from a power amplifier supply voltage, and a power management circuit including an envelope tracker configured to generate the power amplifier supply voltage based on an envelope signal corresponding to an envelope of the radio frequency transmit signal. The envelope tracker includes a DC-to-DC converter configured to output a plurality of regulated voltages, a modulator configured to control the power amplifier supply voltage based on the plurality of regulated voltages and the envelope signal, and a switching point adaptation circuit configured to control a voltage level of at least one of the plurality of regulated voltages based on a power level of the radio frequency transmit signal.

In various embodiments, the switching point adaptation circuit is configured to control the voltage level of each of the plurality of regulated voltages based on the power level of the radio frequency transmit signal.

In some embodiments, the switching point adaptation circuit includes a power estimation circuit configured to estimate the power level of the radio frequency transmit signal based on a signal power value for at least one of a transmit frame or a transmit symbol. According to a number of embodiments, the signal power value indicates an average power for the transmit frame or symbol. In accordance with various embodiments, the signal power value indicates a peak power for the transmit frame or symbol. According to several embodiments, the switching point adaptation circuit further includes a voltage estimation circuit configured to estimate a plurality of desired voltage levels associated with the signal power value. In accordance with a number of embodiments, the switching point adaptation circuit further includes a programming circuit configured to control the DC-to-DC converter to output the plurality of regulated voltages each with a corresponding one of the plurality of desired voltage levels.

In several embodiments, the mobile device further includes two or more power amplifiers configured to amplify two or more radio frequency transmit signals, the envelope tracker including two or more modulators each configured to receive the plurality of regulated voltages and to provide modulation to generate a supply voltage for a corresponding one of the two or more power amplifiers. According to various embodiments, the switching point adaptation circuit is configured to control the voltage level based on a largest power level of the two or more radio frequency transmit signals.

In some embodiments, the DC-to-DC converter is configured to receive a battery voltage, and to generate the plurality of regulated voltages based on providing DC-to-DC conversion of the battery voltage.

In various embodiments, each of the plurality of regulated voltages has a different voltage level.

In several embodiments, the envelope tracker further includes a plurality of decoupling capacitors each coupled between ground and a corresponding one of the plurality of regulated voltages.

In some embodiments, the modulator includes a plurality of switches each coupled between the modulator output voltage and a corresponding one of the plurality of regulated voltages.

In various embodiments, mobile device further includes a modulator output filter connected between an output of the modulator and the power amplifier supply voltage, the modulator output filter including at least one series inductor and at least one shunt capacitor.

In certain embodiments, the present disclosure relates to a method of envelope tracking. The method includes amplifying a radio frequency signal using a power amplifier, supplying power to the power amplifier using a power amplifier supply voltage, outputting a plurality of regulated voltages from a DC-to-DC converter, and controlling the power amplifier supply voltage based on the plurality of regulated voltages and an envelope signal using a modulator, the envelope signal corresponding to an envelope of the radio frequency signal. The method further includes controlling a voltage level of at least one of the plurality of regulated voltages based on a power level of the radio frequency signal.

In various embodiments, the method further includes controlling each of the plurality of regulated voltages based on the power level of the radio frequency signal.

In some embodiments, the method further includes estimating the power level of the radio frequency signal based on a signal power value for at least one of a transmit frame or a transmit symbol. According to a number of embodiments, the signal power value indicates an average power for the transmit frame or symbol. In accordance with several embodiments, the signal power value indicates a peak power for the transmit frame or symbol. According to various embodiment, the method further includes estimating a plurality of desired voltage levels associated with the signal power value. In accordance with several embodiments, the method further includes controlling the DC-to-DC converter to output the plurality of regulated voltages each with a corresponding one of the plurality of desired voltage levels.

In several embodiments, the method further includes generating the plurality of regulated voltages based on providing DC-to-DC conversion of a battery voltage.

In various embodiments, each of the plurality of regulated voltages has a different voltage level.

DETAILED DESCRIPTION OF EMBODIMENTS

Figure 1:
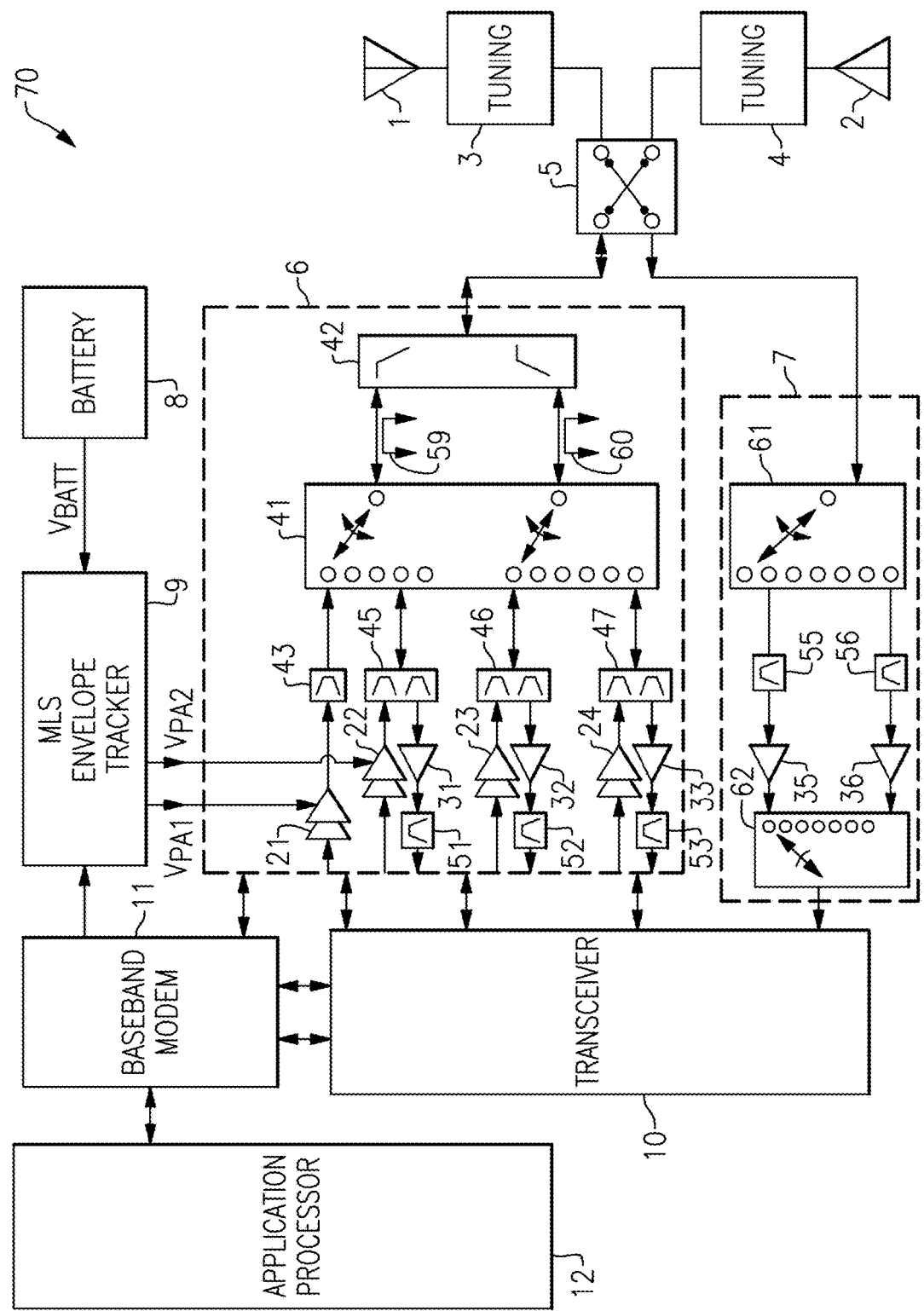
FIG. 1 is a schematic diagram of a mobile device according to one embodiment.

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Envelope tracking is a technique that can be used to increase power added efficiency (PAE) of a power amplifier by efficiently controlling a voltage level of a power amplifier supply voltage in relation to an envelope of a radio frequency (RF) signal amplified by the power amplifier. Thus, when the envelope of the RF signal increases, the voltage supplied to the power amplifier can be increased. Likewise, when the envelope of the RF signal decreases, the voltage supplied to the power amplifier can be decreased to reduce power consumption.

Envelope tracking can include applications in which the envelope signal follows the fast changing instantaneous power of the RF signal. In other applications, the envelope signal can be much slower, for instance, determined by a longer time average of the RF signal. For example, when using symbol by symbol tracking, the envelope signal changes relatively infrequently in comparison to the fast varying instantaneous power of an orthogonal frequency division multiplexing (OFDM) signal. For instance, for a 5G OFDM waveform instantaneous power can change between peaks and troughs in less than 10 ns, while symbols can change every 16 us. In certain implementations, the envelope signal can be based upon the next oncoming peak of the RF signal, thus anticipating rather than following the RF power.

Multi-level envelope tracking systems with adjusted voltage steps are provided. In certain embodiments, an envelope tracking system for generating a power amplifier supply voltage for a power amplifier is provided. The envelope tracking system includes an MLS DC-to-DC converter that outputs multiple regulated voltages, an MLS modulator that controls selection of the regulated voltages over time based on an envelope signal corresponding to an envelope of the RF signal amplified by the power amplifier, and a modulator output filter coupled between an output of the MLS modulator and the power amplifier supply voltage. The envelope tracking system further includes a switching point adaptation circuit configured to control the voltage level of the regulated voltages outputted by the MLS DC-to-DC converter based on a power level of the RF signal.

By controlling the voltage level of the regulated voltages based on the power level of the RF signal, enhanced efficiency can be achieved. For example, the switching point of the MLS DC-to-DC converter can be adapted based on the RF signal's power level to provide a predictive adjustment of the regulated voltages to thereby increase efficiency over a wide range of signal powers.

In certain implementations, the switching point adaptation circuit controls the regulated voltages outputted by the MLS DC-to-DC converter based on a signal power value indicated for a particular transmission slot or frame. For instance, in certain systems, an amount of average and/or peak signal power can be known before a transmission slot or frame (for instance, instructed by a base station of a communication network), and thus can be used to control the voltage levels of the regulated voltages.

Improved performance of a multi-level envelope tracking system can be achieved by adapting the discrete voltage level scale to suitable voltage levels (for instance, minimum and maximum voltage values) corresponding to the signal power (for instance, average power) set during the transmitted burst or frame. Such tracking can be done for a wide range of transmission scenarios, including, but not limited to, time-division duplexing (TDD).

Accordingly, in certain implementations power amplifier supply voltage can be controlled based on the expected peak power for the next burst or frame, or even adjusted dynamically during the transmission. By controlling the regulated voltages in this manner, a size of the voltage steps selected can be decreased to allow for finer tracking of the voltage on the power amplifier.

For instance, prior to the beginning of a transmission, the peak to average and the average power are known and this knowledge allows for the calculation of the maximum and minimum voltage desired. In certain implementations, decoupling capacitors holding charge for each of the regulated voltages of the MLS DC-to-DC converter can be pre-charged to the corresponding voltages.

By implementing an envelope tracking system in this manner, enhanced precision of envelope tracking can be achieved over a wide range of signal power, including, at back off or when operating high and low peak to average.

In certain implementations, the envelope tracking system operates as a power supply capable of switching between multiple voltages to supply a power amplifier through a baseband filter. The power supply is controlled to generate a number of different voltages that are static or fixed compared to the modulation bandwidth of the amplitude of the RF signal waveform through the power amplifier. Additionally, the regulated voltages are adapted to a power demand (for instance, an average power) of the power amplifier.

In certain implementations, the regulated voltages from the MLS DC-to-DC converter are processed by two or more MLS modulators to generate the power amplifier supply voltages of two or more power amplifiers. For instance, carrier aggregation systems, multi-input multiple-output (MIMO) systems, and/or other communications systems can operate using a shared MLS DC-to-DC converter. In certain implementations, the switching point adaptation circuit controls the regulated voltages based on the largest signal power amplified by the power amplifiers.

For instance, in the case of MIMO or carrier aggregation, where multiple power amplifier paths operate simultaneously, the envelope tracking system can select the voltage scale appropriate to the power amplifier carrying the most power. This advantageously allows for reduced power consumption by adapting voltages for the highest power consuming branch first. In certain applications, it can be advantageous to set a fixed supply to one power amplifier by using a single modulator switch position for one power amplifier and allowing the other voltages to be used by the modulator for the second power amplifier.

In certain implementations, a digital pre-distortion (DPD) system pre-calculates voltage settings and pre-distorts the RF based on the knowledge of the power amplifier supply voltage (Vcc) filter characteristics and a calibration of the power amplifier response.

FIG. 1 is a schematic diagram of a mobile device 70 according to one embodiment. The mobile device 70 includes a primary antenna 1, a diversity antenna 2, a primary antenna tuning circuit 3, a diversity antenna tuning circuit 4, a double-pole double-throw (DPDT) antenna diversity switch 5, a primary front end module 6, a diversity front end module 7, a battery 8, an MLS envelope tracker 9, a transceiver 10, a baseband modem 11, and an application processor 12.

Although one embodiment of a mobile device is shown, the teachings herein are applicable to mobile devices implemented in a wide variety of ways. Accordingly, other implementations are possible.

In the illustrated embodiment, the primary front end module 6 includes a first power amplifier 21, a second power amplifier 22, a third power amplifier 23, a fourth power amplifier 24, a first low noise amplifier 31, a second low noise amplifier 32, a third low noise amplifier 33, a diplexer 42, a transmit/receive band switch 41, a transmit filter 43, a first duplexer 45, a second duplexer 46, a third duplexer 47, a first receive filter 51, a second receive filter 52, a third receive filter 53, a first directional coupler 59, and a second directional coupler 60. Additionally, the diversity front end module 7 includes a first low noise amplifier 35, a second low noise amplifier 36, a first receive filter 55, a second receive filter 56, a first receive band selection switch 61, and a second receive band selection switch 62.

Although one embodiment of front end circuitry is shown, other implementations of front end circuitry are possible. For instance, front end circuitry can include power amplifiers (PAs), low noise amplifiers (LNAs), filters, switches, phase shifters, duplexers, and/or other suitable circuitry for processing RF signals transmitted and/or received from one or more antennas. Example functionalities of a front end include but are not limited to, amplifying signals for transmission, amplifying received signals, filtering signals, switching between different bands, switching between different power modes, switching between transmission and receiving modes, duplexing of signals, multiplexing of signals (for instance, diplexing or triplexing), or some combination thereof.

Accordingly, other implementations of primary front end modules, diversity receive front end modules, antenna selection, and/or antenna tuning can be used.

As shown in FIG. 1, the MLS envelope tracker 9 is used to generate one or more power amplifier supply voltages for power amplifiers used in the mobile device 70 to amplify RF signals for wireless transmission. In the illustrated embodiment, the MLS envelope tracker 9 receives a battery voltage $V_{BATT}$ from the battery 8, and generates a first power amplifier supply voltage $V_{PA1}$ for the first power amplifier 21 and a second power amplifier supply voltage $V_{PA2}$ for the first power amplifier 22. Although an example in which the MLS envelope tracker 9 generates two power amplifier supply voltages is shown, the MLS envelope tracker 9 can generate more or fewer power amplifier supply voltages.

The MLS envelope tracker 9 controls the first power amplifier supply voltage $V_{PA1}$ to track an envelope of a first RF signal amplified by the first power amplifier 21. Additionally, the MLS envelope tracker 9 controls the second power amplifier supply voltage $V_{PA2}$ to track an envelope of a second RF signal amplified by the second power amplifier 22. In certain implementations, the MLS envelope tracker 9 receives one or more envelope signals from the baseband modem 11. For example, the MLS envelope tracker 9 can receive a first envelope signal indicating an envelope of the first RF signal and a second envelope signal indicating an envelope of the second RF signal. The envelope signal(s) can be analog or digital.

The battery 8 can be any suitable battery for use in the mobile device 70, including, for example, a lithium-ion battery. The battery voltage $V_{BATT}$ is regulated by a DC-to-DC converter of the MLS envelope tracker 9 to generate regulated voltages used for multi-level envelope tracking in accordance with the teachings herein.

The transceiver 10 generates RF signals for transmission and processes incoming RF signals received from the primary antenna 1 and the diversity antenna 2. It will be understood that various functionalities associated with the transmission and receiving of RF signals can be achieved by one or more components that are collectively represented in FIG. 1 as the transceiver 10. In one example, separate components (for instance, separate circuits or dies) can be provided for handling certain types of RF signals.

The baseband modem 11 provides the transceiver 10 with digital representations of transmit signals, which the transceiver 10 processes to generate RF signals for transmission. The baseband modem 11 also processes digital representations of received signals provided by the transceiver 10.

As shown in FIG. 1, the baseband modem 11 is coupled to the application processor 12, which serves to provide primary application processing in the mobile device 70. The application processor 12 can provide a wide variety of functions, such as providing system capabilities suitable for supporting applications, including, but not limited to, memory management, graphics processing, and/or multimedia decoding.

Although the mobile device 70 illustrates one example of an RF system including a multi-level envelope tracker, a wide variety of RF systems can include a multi-level envelope tracker implemented in accordance with the teachings herein.

Figure 2:
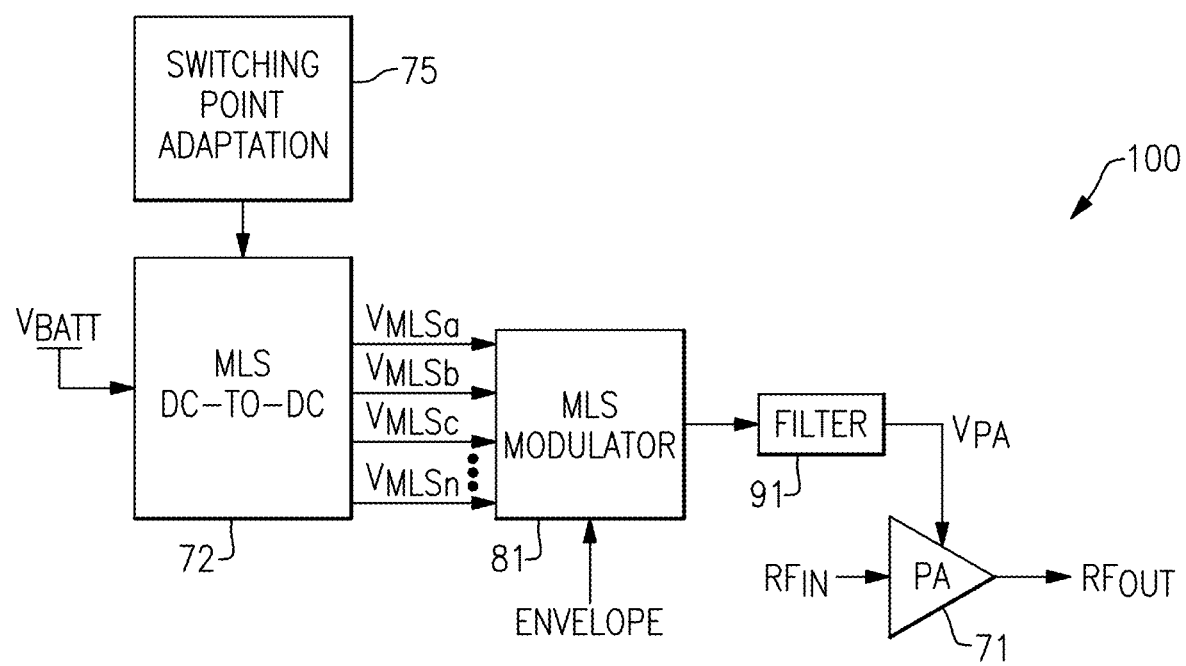
FIG. 2 is a schematic diagram of one embodiment of an envelope tracking system for a power amplifier.
Figure 3A:
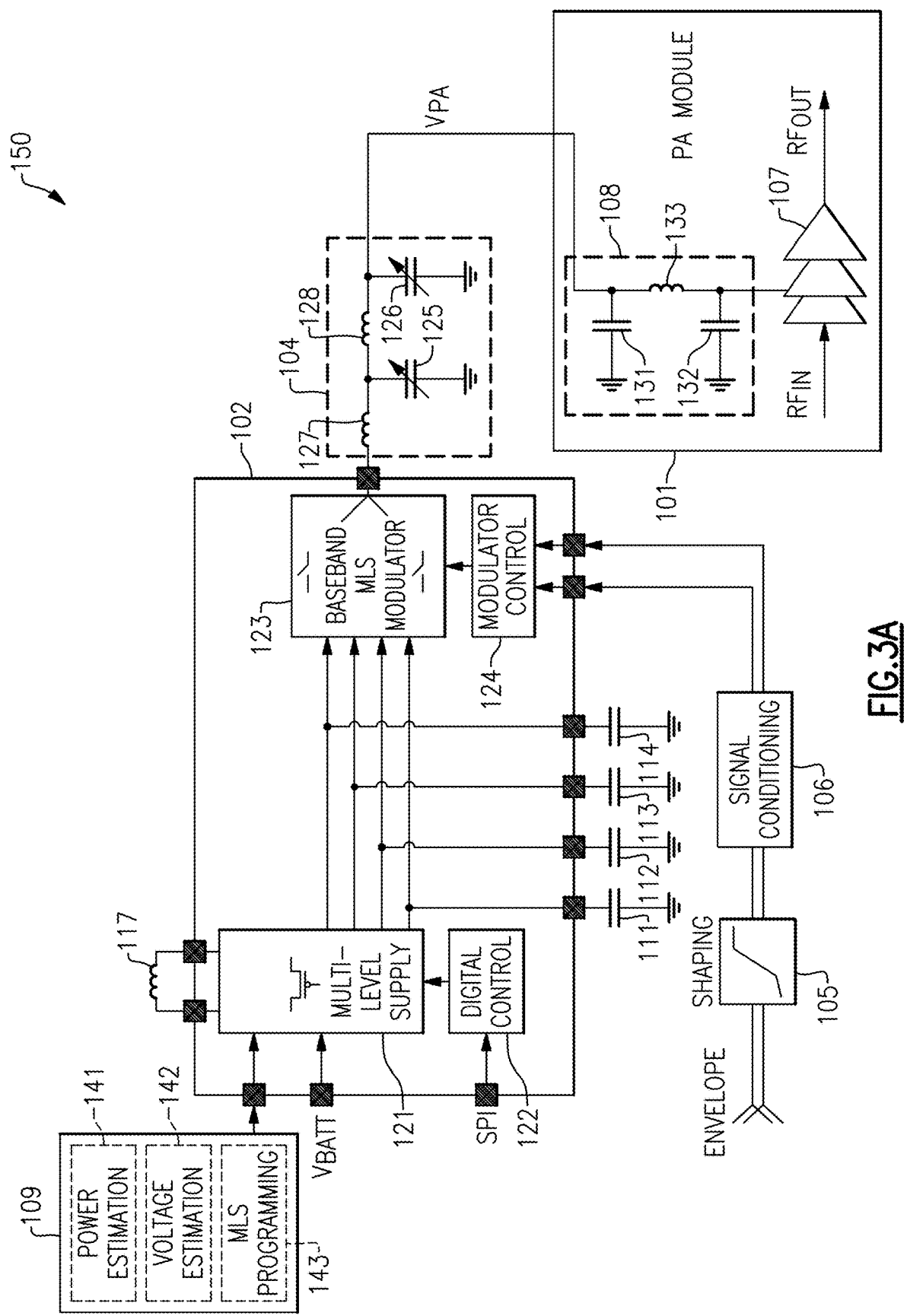
FIG. 3A is a schematic diagram of another embodiment of an envelope tracking system.
Figure 3B:
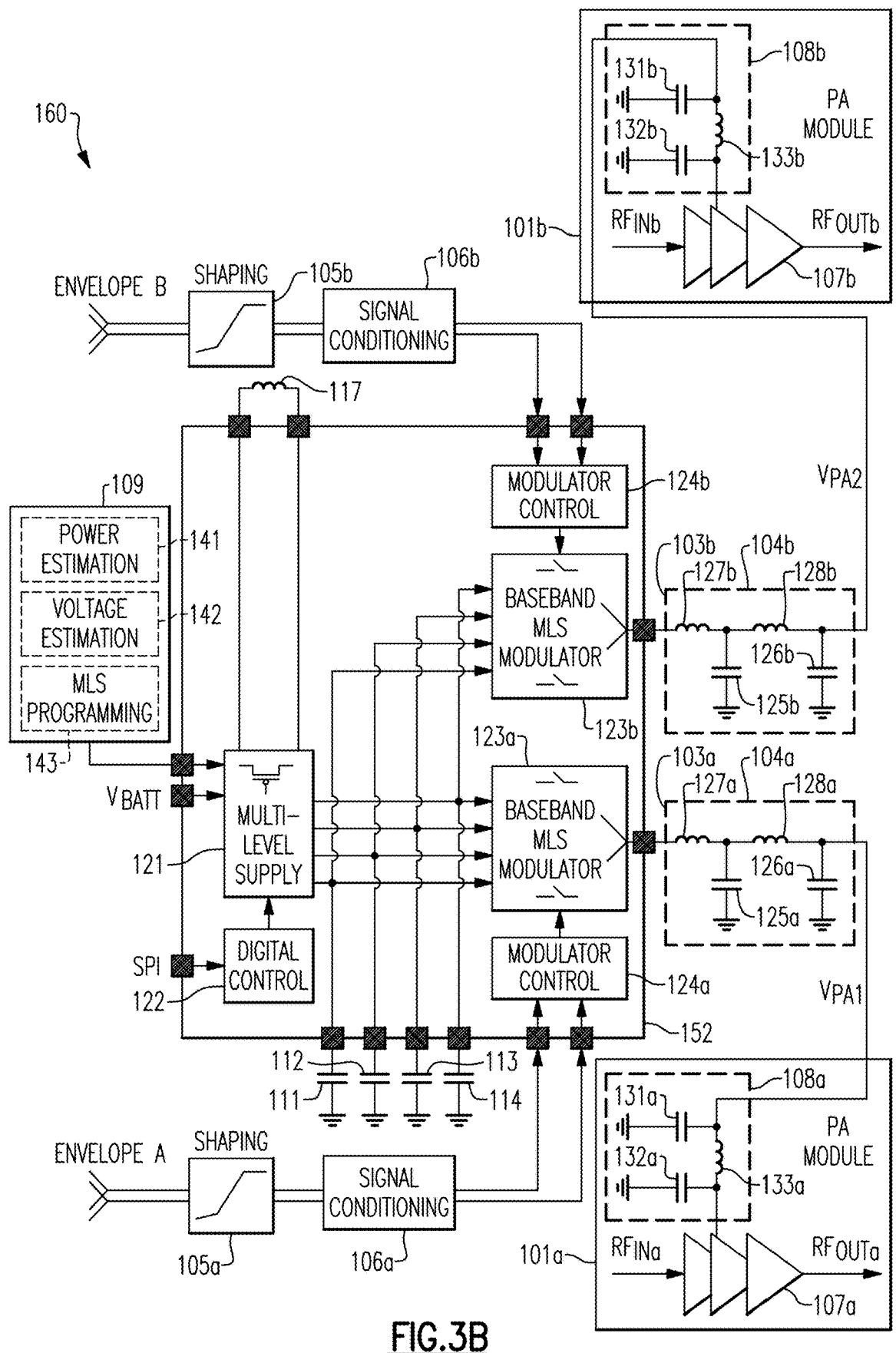
FIG. 3B is a schematic diagram of another embodiment of an envelope tracking system.

FIGS. 2-3B depict schematic diagram of various embodiments of envelope tracking systems for a power amplifier. However, the teachings herein are applicable to envelope trackers implemented in a wide variety of ways. Accordingly, other implementations are possible.

FIG. 2 is a schematic diagram of one embodiment of an envelope tracking system 100 for a power amplifier 71. The envelope tracking system 100 includes an MLS DC-to-DC converter 72, a switching point adaptation circuit 75, an MLS modulator 81, and a modulator output filter 91. The MLS DC-to-DC converter 72 is also referred to herein as a switching regulator.

The power amplifier 71 amplifies an RF input signal $RF_{IN}$ to generate an RF output signal $RF_{OUT}$. The MLS modulator 81 receives an envelope signal (ENVELOPE), which changes in relation to an envelope of the RF input signal $RF_{IN}$.

In the illustrated embodiment, the MLS DC-to-DC converter 72 receives a battery voltage $V_{BATT}$, and provides DC-to-DC conversion to generate a variety of regulated voltages $V_{MLSa}, V_{MLSb}, V_{MLSc} \ldots V_{MLSn}$ of different voltage levels. Although an example in which four MLS voltages is depicted, the MLS DC-to-DC converter 72 can generate more or fewer MLS voltages as indicated by the ellipses.

The MLS modulator 81 receives the regulated voltages $V_{MLSa}, V_{MLSb}, V_{MLSc} \ldots V_{MLSn}$ and the envelope signal, and provides a modulator output voltage to the modulator output filter 91. In certain implementations, the MLS modulator 81 controls the outputted voltage based on selecting a suitable regulated voltage over time based on the envelope signal. For example, the MLS modulator 81 can include a bank of switches for selectively connecting the regulated voltages $V_{MLSa}, V_{MLSb}, V_{MLSc} \ldots V_{MLSn}$ to the modulator's output based on a value of the envelope signal.

The modulator output filter 91 filters the output of MLS modulator 81 to thereby generate a power amplifier supply voltage $V_{PA}$ for the power amplifier 71.

As shown in FIG. 2, the envelope tracking system 100 also includes the switching point adaptation circuit 75, which controls the voltage levels of one or more of the regulated voltages $V_{MLSa}, V_{MLSb}, V_{MLSc} \ldots V_{MLSn}$ based on a power level of the RF signal $RF_{IN}$. In certain implementations, the switching point adaptation circuit 75 controls pulse widths of the MLS DC-to-DC converter 72 used for regulation (see, for example, FIG. 11), thereby controlling the switching points of regulation and the corresponding regulated voltage levels.

By controlling the voltage levels of the regulated voltages $V_{MLSa}$, $V_{MLSb}$, $V_{MLSc}$ ... $V_{MLSn}$ based on a power level of the RF signal $RF_{IN}$, enhanced efficiency can be achieved. For example, the switching point of the MLS DC-to-DC converter 72 can be adapted based on the RF signal's power level, thereby allowing a predictive adjustment of the regulated voltages to thereby increase efficiency over a wide range of signal powers.

In certain implementations, the switching point adaptation circuit 75 controls the voltage levels of the regulated voltages $V_{MLSa}$, $V_{MLSb}$, $V_{MLSc}$ ... $V_{MLSn}$ based on an amount of transmit power indicated in a transmit frame or slot. For example, the switching point adaptation circuit 75 can receive data indicating the amount of transmit power from a baseband modem or other suitable source.

The envelope tracking system 100 is well-suited for applications using symbol by symbol tracking, which can be suitable for high bandwidth modulations. For example, when using symbol by symbol tracking, two MLS voltages can be programmed and used in succession at the symbol rate (for instance, 16 us in 5G). Thus, the MLS modulator 81 can change the voltage used for generating the power amplifier supply voltage by switching to the new voltage holding capacitor.

FIG. 3A is a schematic diagram of another embodiment of an envelope tracking system 150 for a power amplifier module 101. The envelope tracking system 150 includes an envelope tracking integrated circuit (IC) 102, a modulator output filter 104, envelope shaping circuitry 105, envelope signal conditioning circuitry 106, a switching point adaptation circuit 109, first to fourth decoupling capacitors 111-114, respectively, and an inductor 117.

Although one embodiment of an envelope tracking system is shown in FIG. 3A, the teachings herein are applicable to envelope tracking systems implemented in a wide variety of ways. Accordingly, other implementations are possible.

In the illustrated embodiment, the envelope tracking IC 102 includes MLS switching circuitry 121, a digital control circuit 122, a baseband MLS modulator 123, and a modulator control circuit 124. The envelope tracking IC 102 of FIG. 3A is depicted with various pins or pads for providing a variety of functions, such as receiving a battery voltage ($V_{BATT}$), receiving switching point adaptation data from the switching point adaptation circuit 109, communicating over a serial peripheral interface (SPI), receiving an envelope signal (ENVELOPE), connecting to the decoupling capacitors 111-114, and connecting to the inductor 117. An envelope tracking IC is also referred to herein in as an envelope tracking semiconductor die or chip.

The MLS switching circuitry 121 controls a current through the inductor 117 to provide voltage regulation. For example, the MLS switching circuitry 121 can include switches and a controller that turns on and off the switches using any suitable regulation scheme (including, but not limited to, pulse-width modulation) to provide DC-to-DC conversion. In the illustrated embodiment, the MLS switching circuitry 121 outputs four regulated MLS voltages of different voltage levels. However, the MLS switching circuitry 121 can be implemented to output more or fewer regulated voltages.

As shown in FIG. 3A, the MLS switching circuitry 121 is controlled by the digital control circuit 122. The digital control circuit 122 can provide programmability to the MLS switching circuitry 121, the MLS modulator 123, and/or the modulator control circuit 124. As shown in FIG. 3A, the digital control circuit 122 is coupled to the SPI bus. In certain implementations, the digital control circuit 122 controls the MLS switching circuitry 121, the MLS modulator 123, and/or the modulator control circuit 124 based on data received over the SPI bus and/or other chip interface.

The baseband MLS modulator 123 includes an output coupled to the power amplifier supply voltage $V_{PA}$ through the modulator output filter 104. In certain implementations, the baseband MLS modulator 123 includes switches coupled between each of the regulated MLS voltages and the modulator output filter 104. Additionally, the modulator's switches are selectively opened or closed by the modulator controller 124 based on the envelope signal.

In the illustrated embodiment, the modulator output filter 104 includes a first series inductor 127, a second series inductor 128, a first shunt capacitor 125, and a second shunt capacitor 126. Although an example implementation of a modulator output filter is depicted in FIG. 3A, the teachings herein are applicable to modulator output filter filters implemented in a wide variety of ways. Accordingly, other implementations of filters can be used in accordance with the teachings herein.

In certain implementations, one or more components of a filter are controllable (for instance, digitally programmable and/or analog-tuned) to provide enhanced flexibility and/or configurability. For example, in the illustrated embodiment, the first shunt capacitor 125 and the second shunt capacitor 126 have capacitance values that are controllable. Although two examples of controllable filter components are shown, other filter components can additionally or alternatively be implemented to be controllable.

In the illustrated embodiment, the power amplifier module 101 includes a power amplifier 107 and supply voltage filter 108. The supply voltage filter 108 includes a series inductor 133, a first shunt capacitor 131, and a second shunt capacitor 132. Although one implementation of a power amplifier module is shown, the teachings herein are applicable to power amplifier modules implemented in a wide variety of ways. Accordingly, other implementations are possible.

As shown in FIG. 3A, the switching point adaptation circuit 109 includes a power estimation circuit 141, a voltage estimation circuit 142, and an MLS programming circuit 143. The power estimation circuit 141 operates to estimate a signal power of the RF signal $RF_{IN}$. In certain implementations, the power estimation circuit 141 receives digital data indicating a signal power associated with a particular transmit frame or slot.

The voltage estimation circuit 142 operates to estimate desired voltage levels of one or more of the regulated output voltages of the MLS switching circuitry 121 based on the estimated power. The MLS programming circuit 143 operates to program the MLS switching circuitry 121 based on the estimated voltage. In the illustrated embodiment, the MLS switching circuitry 121 is programmed over a separate interface from the SPI bus. In another embodiment, the switching point adaptation circuit 109 programs the MLS switching circuitry 121 over the SPI bus and/or other common interface to the envelope tracking IC 102.

Although one embodiment of a switching point adaptation circuit is shown, the teachings herein are applicable to switching point adaptation circuits implemented in a wide variety of ways.

FIG. 3B is a schematic diagram of another embodiment of an envelope tracking system 160. The envelope tracking system 160 includes an envelope tracking IC 152, a first modulator output filter 104a, a second modulator output filter 104b, first envelope shaping circuitry 105a, second envelope shaping circuitry 105b, first envelope signal conditioning circuitry 106a, second envelope signal conditioning circuitry 106b, a switching point adaptation circuit 109, first to fourth decoupling capacitors 111-114, respectively, and an inductor 117. The envelope tracking system 160 generates a first power amplifier supply voltage $V_{PA1}$ for the first power amplifier module 101a, and a second power amplifier supply voltage $V_{PA2}$ for the second power amplifier module 101b.

In the illustrated embodiment, the envelope tracking IC 152 includes MLS switching circuitry 121, a digital control circuit 122, a first baseband MLS modulator 123a, a second baseband MLS modulator 123b, a first modulator control circuit 124a, and a second modulator control circuit 124b.

The envelope tracking system 160 of FIG. 3B is similar to the envelope tracking system 150 of FIG. 3A, except that the envelope tracking system 160 illustrates one implementation in which a common or shared MLS DC-to-DC converter is used in combination with multiple modulators to generate multiple power amplifier supply voltages.

In certain implementations, the regulated voltages from an MLS DC-to-DC converter are processed by two or more MLS modulators to generate the power amplifier supply voltages of two or more power amplifiers. In certain implementations, the switching point adaptation circuit controls the regulated voltages based on the largest signal power amplified by the power amplifiers.

Figure 4:
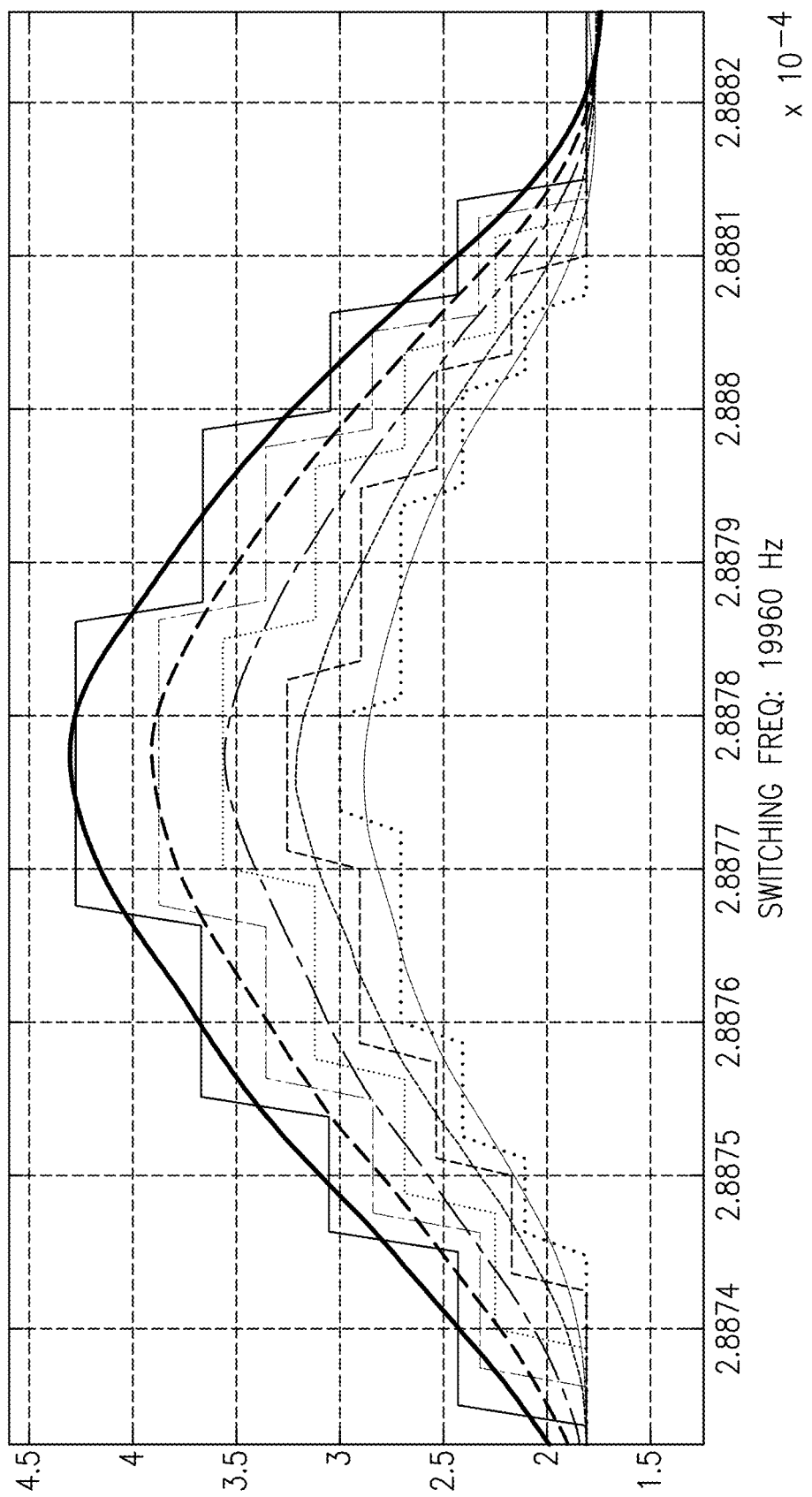
FIG. 4 is a graph of voltage versus time for five examples of signal waveforms of different power levels.

FIG. 4 is a graph of voltage versus time for five examples of signal waveforms of different power levels. The illustrated example is depicted for MCSO 20 MHz WLAN waveforms of five levels, with 30 MHz power supply filter bandwidth.

As shown in FIG. 4, the 5 voltage levels in this example are set based on the amplitude of the signal such that the minimum and maximum of the voltage levels match those of the time varying waveform. For example, FIG. 4 depicts for 5 different average powers, 5 different voltage scales that track a pulse of amplitude versus time.

Figure 5A:
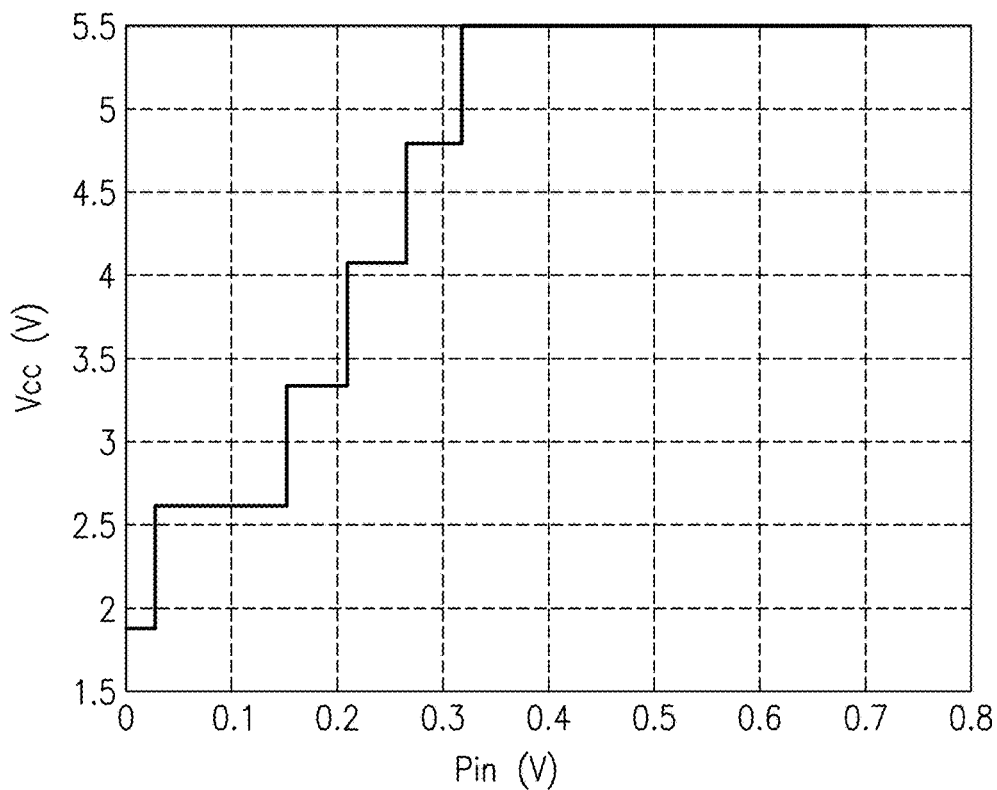
FIG. 5A is a graph of one example of power amplifier supply voltage versus input power.

FIG. 5A is a graph of one example of power amplifier supply voltage versus input power. The example shows a voltage scale for 24 dBm of power without an adapted voltage table. Voltage steps are between 1.7 V and 5.5 V, with 5.5 V corresponding to maximum peak power of 35 dBm, satisfying 30.5 dBm average output power for a typical LTE waveform.

Figure 5B:
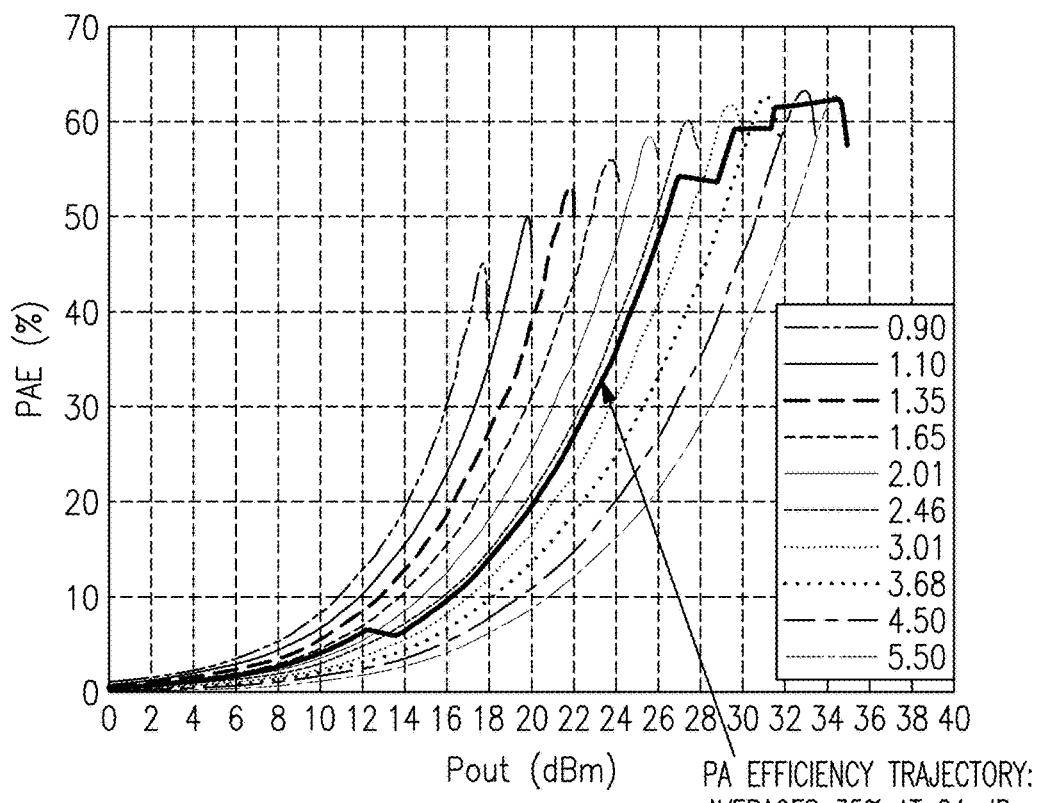
FIG. 5B is a graph of one example of power added efficiency (PAE) versus output power for various examples of signal waveforms.

FIG. 5B is a graph of one example of power added efficiency (PAE) versus output power for various examples of signal waveforms.

A single voltage is chosen for each power on the x axis, resulting in an efficiency curve selected for a given voltage at each power. The combination of the single voltages chosen for each power draws a jagged overlaid efficiency curve, which represents the realizable power amplifier efficiency for the system.

The example shows results for various waveforms, with a power amplifier efficiency average at 24 dBm of about 35%.

Figure 6A:
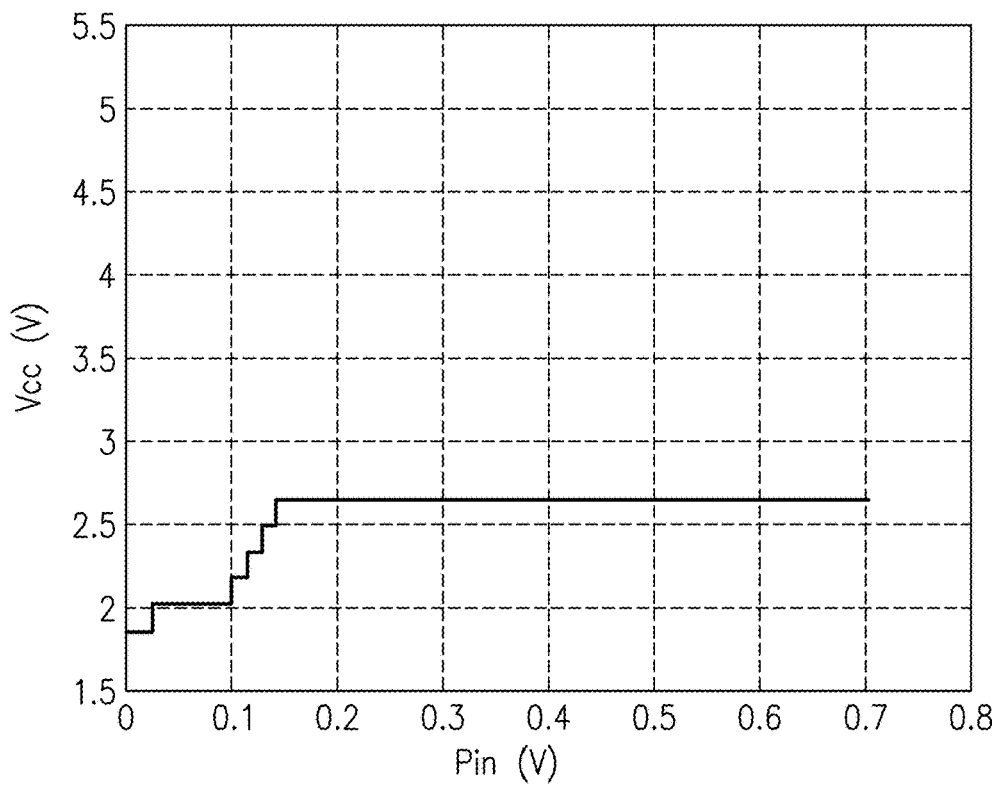
FIG. 6A is a graph of another example of power amplifier supply voltage versus input power.

FIG. 6A is a graph of another example of power amplifier supply voltage versus input power. The example shows a voltage scale for 24 dBm of power with one example of an adapted voltage steps. Voltage steps are between 1.7 V and 2.7 V, with 2.7 V corresponding to max peak power of 28.5 dBm, satisfying 24 dBm average output power for a typical LTE waveform.

Figure 6B:
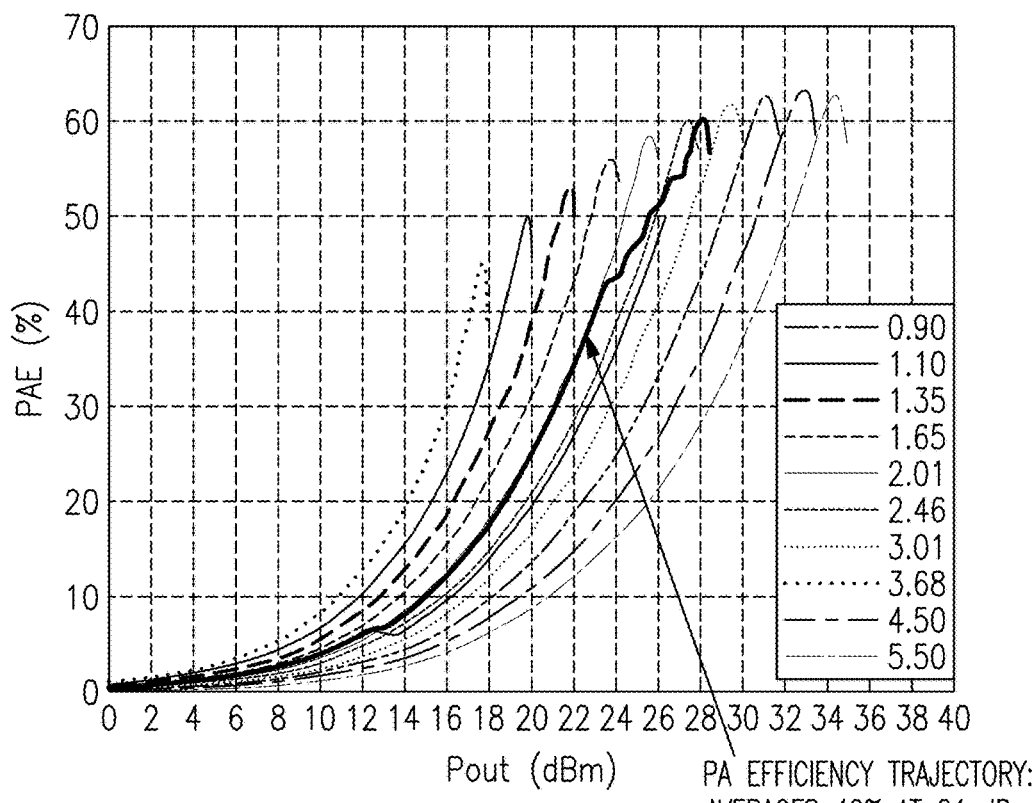
FIG. 6B is a graph of another example of PAE versus output power for various examples of signal waveforms.

FIG. 6B is a graph of another example of PAE versus output power for various examples of signal waveforms. The example shows results for various waveforms, with a power amplifier efficiency average at 24 dBm of about 42%. This is a significant improvement over the 35% efficiency number associated with FIG. 5B. By selecting lower voltages precisely adapted to the 24 dBm average transmit power, the realizable power amplifier efficiency is significantly improved.

Figure 7:
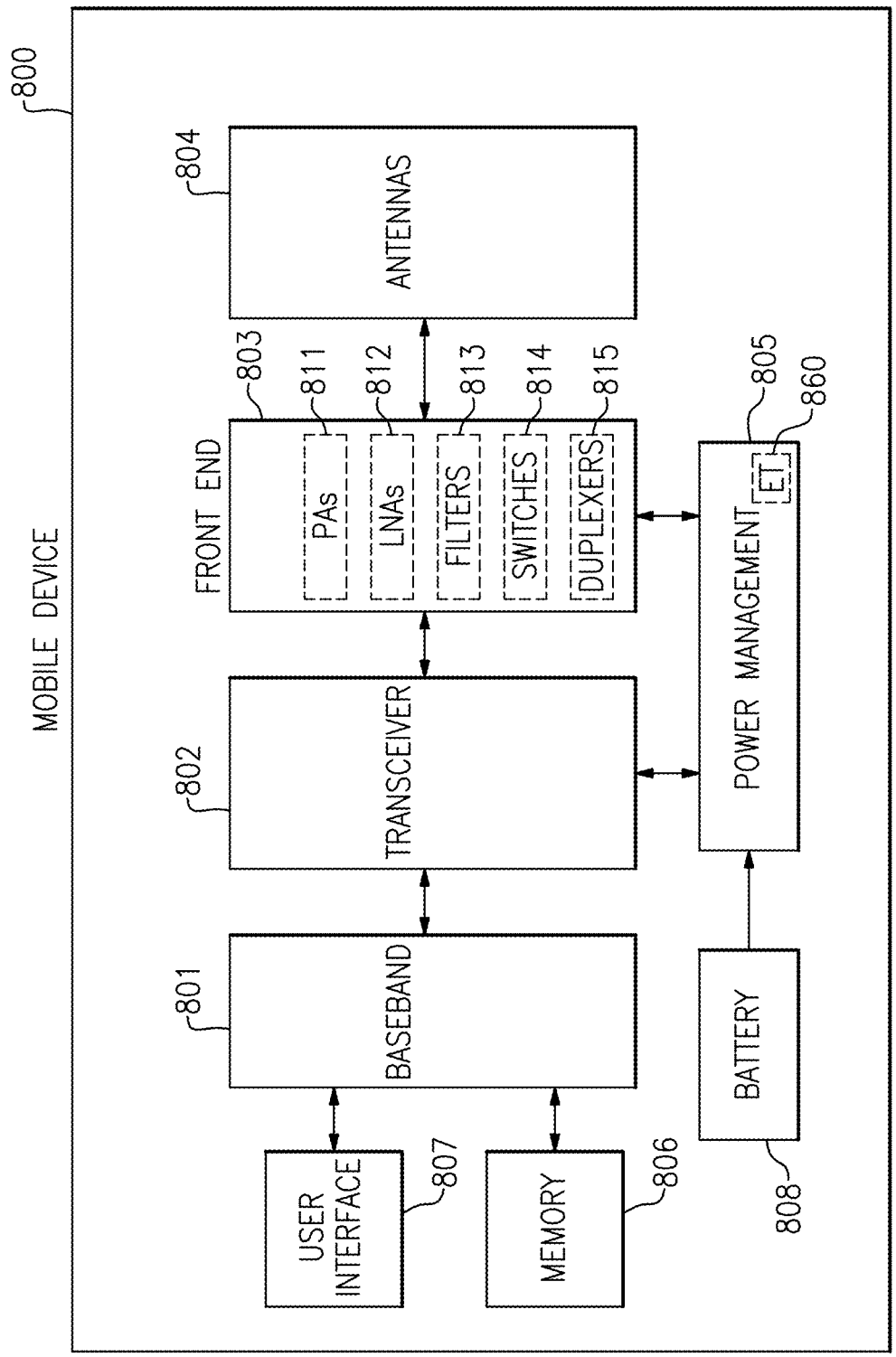
FIG. 7 is a schematic diagram of a mobile device according to another embodiment.

FIG. 7 is a schematic diagram of a mobile device 800 according to another embodiment. The mobile device 800 includes a baseband system 801, a transceiver 802, a front end system 803, antennas 804, a power management system 805, a memory 806, a user interface 807, and a battery 808.

The mobile device 800 can be used communicate using a wide variety of communications technologies, including, but not limited to, 2G, 3G, 4G (including LTE, LTE-Advanced, and LTE-Advanced Pro), 5G, WLAN (for instance, Wi-Fi), WPAN (for instance, Bluetooth and ZigBee), WMAN (for instance, WiMax), and/or GPS technologies.

The transceiver 802 generates RF signals for transmission and processes incoming RF signals received from the antennas 804. It will be understood that various functionalities associated with the transmission and receiving of RF signals can be achieved by one or more components that are collectively represented in FIG. 7 as the transceiver 802. In one example, separate components (for instance, separate circuits or dies) can be provided for handling certain types of RF signals.

The front end system 803 aids is conditioning signals transmitted to and/or received from the antennas 804. In the illustrated embodiment, the front end system 803 includes power amplifiers (PAs) 811, low noise amplifiers (LNAs) 812, filters 813, switches 814, and duplexers 815. However, other implementations are possible.

For example, the front end system 803 can provide a number of functionalizes, including, but not limited to, amplifying signals for transmission, amplifying received signals, filtering signals, switching between different bands, switching between different power modes, switching between transmission and receiving modes, duplexing of signals, multiplexing of signals (for instance, diplexing or triplexing), or some combination thereof.

In certain implementations, the mobile device 800 supports carrier aggregation, thereby providing flexibility to increase peak data rates. Carrier aggregation can be used for both Frequency Division Duplexing (FDD) and Time Division Duplexing (TDD), and may be used to aggregate a plurality of carriers or channels. Carrier aggregation includes contiguous aggregation, in which contiguous carriers within the same operating frequency band are aggregated. Carrier aggregation can also be non-contiguous, and can include carriers separated in frequency within a common band or in different bands.

The antennas 804 can include antennas used for a wide variety of types of communications. For example, the antennas 804 can include antennas associated transmitting and/or receiving signals associated with a wide variety of frequencies and communications standards.

In certain implementations, the antennas 804 support MIMO communications and/or switched diversity communications. For example, MIMO communications use multiple antennas for communicating multiple data streams over a single radio frequency channel. MIMO communications benefit from higher signal to noise ratio, improved coding, and/or reduced signal interference due to spatial multiplexing differences of the radio environment. Switched diversity refers to communications in which a particular antenna is selected for operation at a particular time. For example, a switch can be used to select a particular antenna from a group of antennas based on a variety of factors, such as an observed bit error rate and/or a signal strength indicator.

The mobile device 800 can operate with beamforming in certain implementations. For example, the front end system 803 can include phase shifters having variable phase controlled by the transceiver 802. Additionally, the phase shifters are controlled to provide beam formation and directivity for transmission and/or reception of signals using the antennas 804. For example, in the context of signal transmission, the phases of the transmit signals provided to the antennas 804 are controlled such that radiated signals from the antennas 804 combine using constructive and destructive interference to generate an aggregate transmit signal exhibiting beam-like qualities with more signal strength propagating in a given direction. In the context of signal reception, the phases are controlled such that more signal energy is received when the signal is arriving to the antennas 804 from a particular direction. In certain implementations, the antennas 804 include one or more arrays of antenna elements to enhance beamforming.

The baseband system 801 is coupled to the user interface 807 to facilitate processing of various user input and output (I/O), such as voice and data. The baseband system 801 provides the transceiver 802 with digital representations of transmit signals, which the transceiver 802 processes to generate RF signals for transmission. The baseband system 801 also processes digital representations of received signals provided by the transceiver 802. As shown in FIG. 7, the baseband system 801 is coupled to the memory 806 of facilitate operation of the mobile device 800.

The memory 806 can be used for a wide variety of purposes, such as storing data and/or instructions to facilitate the operation of the mobile device 800 and/or to provide storage of user information.

The power management system 805 provides a number of power management functions of the mobile device 800. The power management system 805 can include an MLS envelope tracker 860 implemented in accordance with one or more features of the present disclosure.

As shown in FIG. 7, the power management system 805 receives a battery voltage form the battery 808. The battery 808 can be any suitable battery for use in the mobile device 800, including, for example, a lithium-ion battery.

Figure 8:
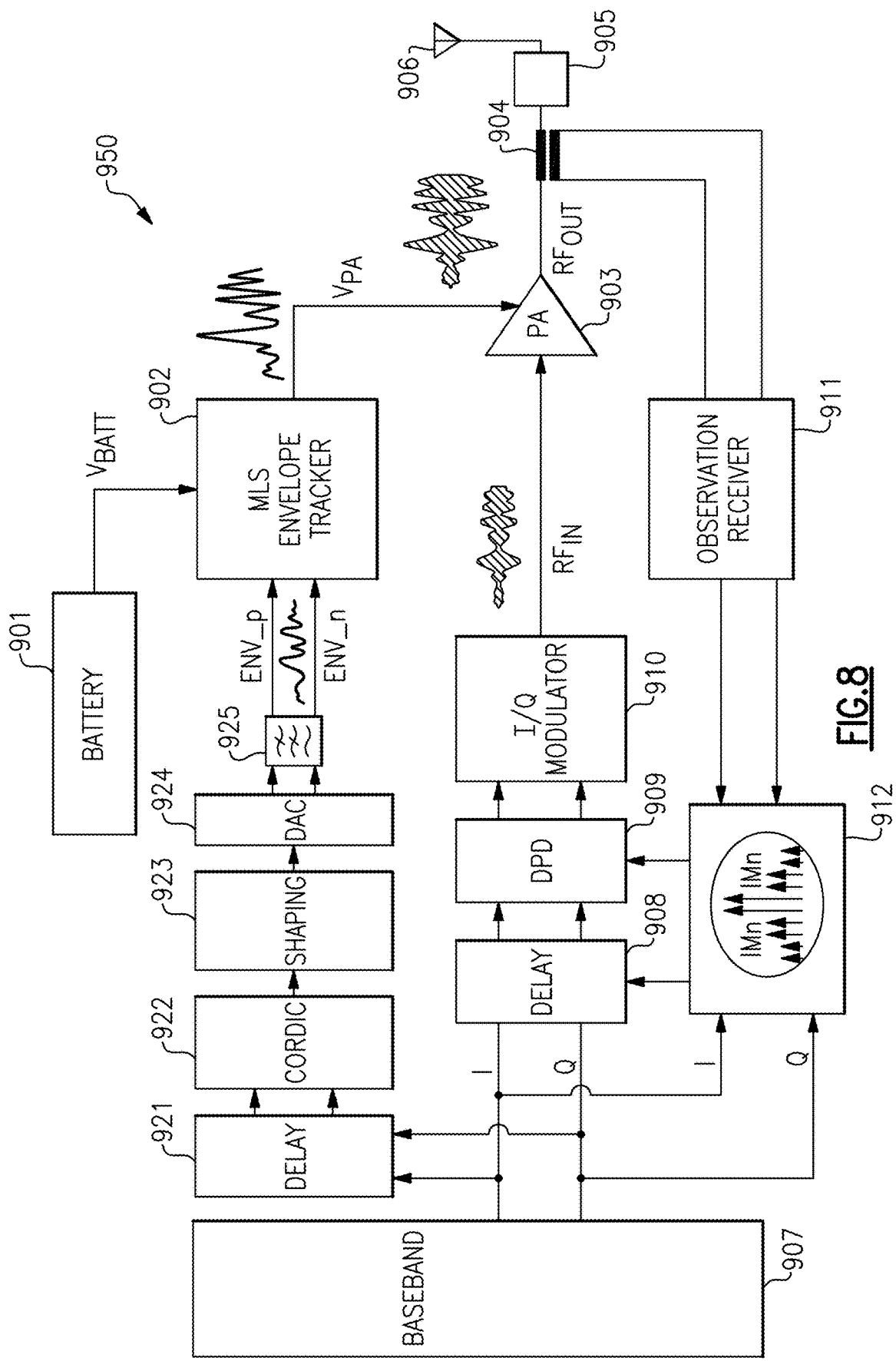
FIG. 8 is a schematic diagram of one embodiment of a communication system for transmitting radio frequency (RF) signals.

FIG. 8 is a schematic diagram of one embodiment of a communication system 950 for transmitting RF signals. The communication system 950 includes a battery 901, an MLS envelope tracker 902, a power amplifier 903, a directional coupler 904, a duplexing and switching circuit 905, an antenna 906, a baseband processor 907, a signal delay circuit 908, a digital pre-distortion (DPD) circuit 909, an I/Q modulator 910, an observation receiver 911, an intermodulation detection circuit 912, an envelope delay circuit 921, a coordinate rotation digital computation (CORDIC) circuit 922, a shaping circuit 923, a digital-to-analog converter 924, and a reconstruction filter 925.

The communication system 950 of FIG. 8 illustrates one example of an RF system that can include an envelope tracking system implemented in accordance with one or more features of the present disclosure. However, the teachings herein are applicable to RF systems implemented in a wide variety of ways.

The baseband processor 907 operates to generate an in-phase (I) signal and a quadrature-phase (Q) signal, which correspond to signal components of a sinusoidal wave or signal of a desired amplitude, frequency, and phase. For example, the I signal and the Q signal provide an equivalent representation of the sinusoidal wave. In certain implementations, the I and Q signals are outputted in a digital format. The baseband processor 907 can be any suitable processor for processing baseband signals. For instance, the baseband processor 907 can include a digital signal processor, a microprocessor, a programmable core, or any combination thereof.

The signal delay circuit 908 provides adjustable delay to the I and Q signals to aid in controlling relative alignment between the differential envelope signal ENV_p, ENV_n provided to the MLS envelope tracker 902 and the RF signal $RF_{IN}$ provided to the power amplifier 903. The amount of delay provided by the signal delay circuit 908 is controlled based on amount of intermodulation in adjacent bands detected by the intermodulation detection circuit 912.

The DPD circuit 909 operates to provide digital shaping to the delayed I and Q signals from the signal delay circuit 908 to generate digitally pre-distorted I and Q signals. In the illustrated embodiment, the DPD provided by the DPD circuit 909 is controlled based on amount of intermodulation detected by the intermodulation detection circuit 912. The DPD circuit 909 serves to reduce a distortion of the power amplifier 903 and/or to increase the efficiency of the power amplifier 903.

The I/Q modulator 910 receives the digitally pre-distorted I and Q signals, which are processed to generate the RF signal $RF_{IN}$. For example, the I/Q modulator 910 can include DACs configured to convert the digitally pre-distorted I and Q signals into an analog format, mixers for upconverting the analog I and Q signals to radio frequency, and a signal combiner for combining the upconverted I and Q signals into the RF signal $RF_{IN}$. In certain implementations, the I/Q modulator 910 can include one or more filters configured to filter frequency content of signals processed therein.

The envelope delay circuit 921 delays the I and Q signals from the baseband processor 907. Additionally, the CORDIC circuit 922 processes the delayed I and Q signals to generate a digital envelope signal representing an envelope of the RF signal $RF_{IN}$. Although FIG. 8 illustrates an implementation using the CORDIC circuit 922, an envelope signal can be obtained in other ways.

The shaping circuit 923 operates to shape the digital envelope signal to enhance the performance of the communication system 950. In certain implementations, the shaping circuit 923 includes a shaping table that maps each level of the digital envelope signal to a corresponding shaped envelope signal level. Envelope shaping can aid in controlling linearity, distortion, and/or efficiency of the power amplifier 903.

In the illustrated embodiment, the shaped envelope signal is a digital signal that is converted by the DAC 924 to a differential analog envelope signal. Additionally, the differential analog envelope signal is filtered by the reconstruction filter 925 to generate a differential envelope signal ENV_p, ENV_n suitable for use by a differential envelope amplifier of the MLS envelope tracker 902. In certain implementations, the reconstruction filter 925 includes a differential low pass filter.

Although one example of envelope signaling is shown, the teachings herein are applicable to envelope signaling implemented in a wide variety of ways. For instance, in another example, the DAC 924 and the reconstruction filter 925 are omitted in favor of providing the MLS envelope tracker 902 with digital envelope data.

With continuing reference to FIG. 8, the MLS envelope tracker 902 receives the envelope signal from the reconstruction filter 925 and a battery voltage $V_{BATT}$ from the battery 901, and uses the differential envelope signal ENV_p, ENV_n to generate a power amplifier supply voltage $V_{CC\_PA}$ for the power amplifier 903 that changes in relation to the envelope of the RF signal $RF_{IN}$. The power amplifier 903 receives the RF signal $RF_{IN}$ from the I/Q modulator 910, and provides an amplified RF signal $RF_{OUT}$ to the antenna 906 through the duplexing and switching circuit 905, in this example.

The directional coupler 904 is positioned between the output of the power amplifier 903 and the input of the duplexing and switching circuit 905, thereby allowing a measurement of output power of the power amplifier 903 that does not include insertion loss of the duplexing and switching circuit 905. The sensed output signal from the directional coupler 904 is provided to the observation receiver 911, which can include mixers for providing down conversion to generate downconverted I and Q signals, and DACs for generating I and Q observation signals from the downconverted I and Q signals.

The intermodulation detection circuit 912 determines an intermodulation product between the I and Q observation signals and the I and Q signals from the baseband processor 907. Additionally, the intermodulation detection circuit 912 controls the DPD provided by the DPD circuit 909 and/or a delay of the signal delay circuit 908 to control relative alignment between the differential envelope signal ENV_p, ENV_n and the RF signal $RF_{IN}$. In another embodiment, the intermodulation detection circuit 912 additionally or alternatively controls a delay of the signal delay circuit 921.

By including a feedback path from the output of the power amplifier 903 and baseband, the I and Q signals can be dynamically adjusted to optimize the operation of the communication system 950. For example, configuring the communication system 950 in this manner can aid in providing power control, compensating for transmitter impairments, and/or in performing DPD.

Although illustrated as a single stage, the power amplifier 903 can include one or more stages. Furthermore, the teachings herein are applicable to communication systems including multiple power amplifiers.

Figure 9:
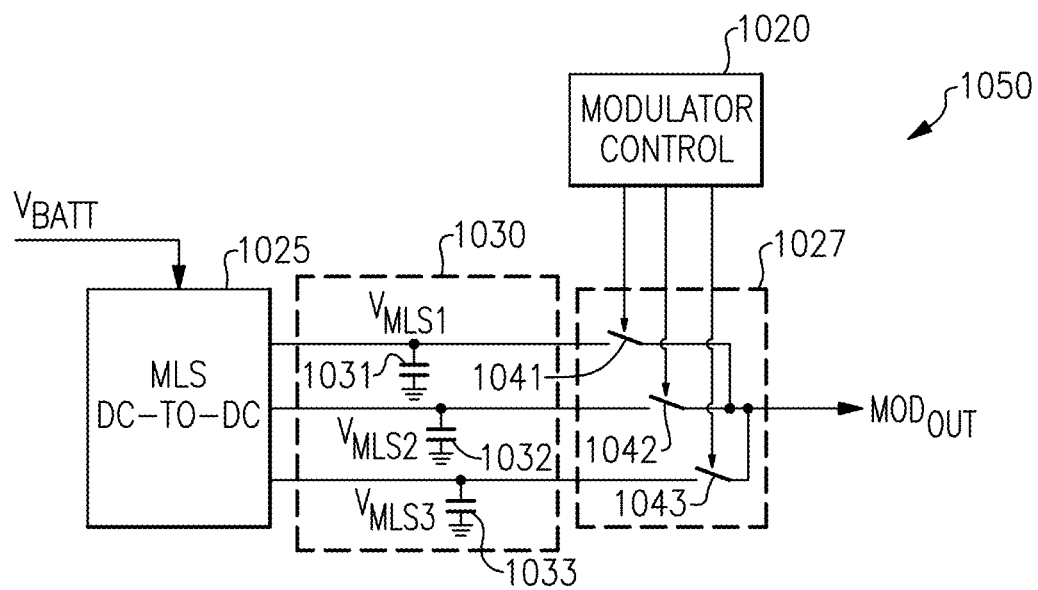
FIG. 9 is a schematic diagram of a multi-level supply (MLS) modulation system according to one embodiment.

FIG. 9 is a schematic diagram of an MLS modulation system 1050 according to one embodiment. The MLS modulation system 1050 includes a modulator control circuit 1020, an MLS DC-to-DC converter 1025, a modulator switch bank 1027, and a decoupling capacitor bank 1030.

The MLS modulation system 1050 of FIG. 9 illustrates one implementation of MLS modulator circuitry suitable for incorporation in a multi-level envelope tracker. However, other implementations of MLS modulator circuitry can be included in multi-level envelope trackers implemented in accordance with the teachings herein.

The MLS DC-to-DC converter 1025 generates a first regulated voltage $V_{MLS1}$, a second regulated voltage $V_{MLS2}$, and a third regulated voltage $V_{MLS3}$ based on providing DC-to-DC conversion of a battery voltage $V_{BATT}$. Although an example with three regulated voltages is shown, the MLS DC-to-DC converter 1025 can generate more or fewer regulated voltages. In certain implementations, at least a portion of the regulated voltages are boosted relative to the battery voltage $V_{BATT}$. Additionally or alternatively, one or more of the regulated voltages is a buck voltage having a voltage lower than the battery voltage $V_{BATT}$.

The decoupling capacitor bank 1030 aids in stabilizing the regulated voltages generated by the MLS DC-to-DC converter 1025. For example, the decoupling capacitor bank 1030 of FIG. 9 includes a first decoupling capacitor 1031 for decoupling the first regulated voltage $V_{MLS1}$, a second decoupling capacitor 1032 for decoupling the second regulated voltage $V_{MLS2}$, and a third decoupling capacitor 1033 for decoupling the third regulated voltage $V_{MLS3}$.

With continuing reference to FIG. 9, the modulator switch bank 1027 includes a first switch 1041 connected between the modulator's output ($MOD_{OUT}$) and the first regulated voltage $V_{MLS1}$, a second switch 1042 connected between the modulator's output and the second regulated voltage $V_{MLS2}$, and a third switch 1043 connected between the modulator's output and the third regulated voltage $V_{MLS3}$. The modulator control 1020 operates to selectively open or close the switches 1041-1043 to thereby control modulator's output.

Figure 10:
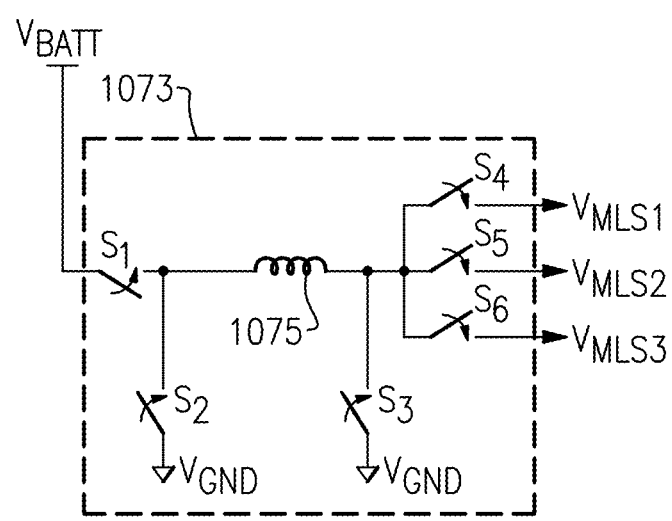
FIG. 10 is a schematic diagram of an MLS DC-to-DC converter according to one embodiment.

FIG. 10 is a schematic diagram of an MLS DC-to-DC converter 1073 according to one embodiment. The MLS DC-to-DC converter 1073 includes an inductor 1075, a first switch $S_1$, a second switch $S_2$, a third switch $S_3$, a fourth switch $S_4$, a fifth switch $S_5$, and a sixth switch $S_6$. The MLS DC-to-DC converter 1073 further includes control circuitry (not shown in FIG. 10) for opening and closing the switches to provide regulation.

The MLS DC-to-DC converter 1073 of FIG. 10 illustrates one implementation of an MLS DC-to-DC converter suitable for incorporation in a multi-level envelope tracker. However, other implementations of MLS DC-to-DC converters can be included in multi-level envelope trackers implemented in accordance with the teachings herein.

In the illustrated embodiment, the first switch $S_1$ includes a first end electrically connected to the battery voltage $V_{BATT}$ and a second end electrically connected to a first end of the second switch $S_2$ and to a first end of the inductor 1075. The second switch $S_2$ further includes a second end electrically connected to a first or ground supply $V_{GND}$. Although FIG. 10 illustrates a configuration of a DC-to-DC converter that is powered using a ground supply and a battery voltage, the teachings herein are applicable to DC-to-DC converters powered using any suitable power supplies. The inductor 1075 further includes a second end electrically connected to a first end of each of the third to sixth switches $S_3$-$S_6$. The third switch $S_3$ further includes a second end electrically connected to the ground supply $V_{GND}$. The fourth, fifth, and sixth switches $S_4$-$S_6$ each include a second end configured to generate the first, second, and third regulated voltages $V_{MLS1}$, $V_{MLS2}$, and $V_{MLS3}$, respectively.

The first to sixth switches $S_1$-$S_6$ are selectively opened or closed to maintain regulated voltages within a particular error tolerance of target voltage levels. Although an example with three regulated voltages is shown, the MLS DC-to-DC converter 1073 can be implemented to generate more or fewer regulated voltages.

In the illustrated embodiment, the MLS DC-to-DC converter 1073 operates as a buck-boost converter operable to generate regulated boost voltages greater than the battery voltage $V_{BATT}$ and/or regulated buck voltages lower than the battery voltage $V_{BATT}$. However, other implementations are possible.

Figure 11:
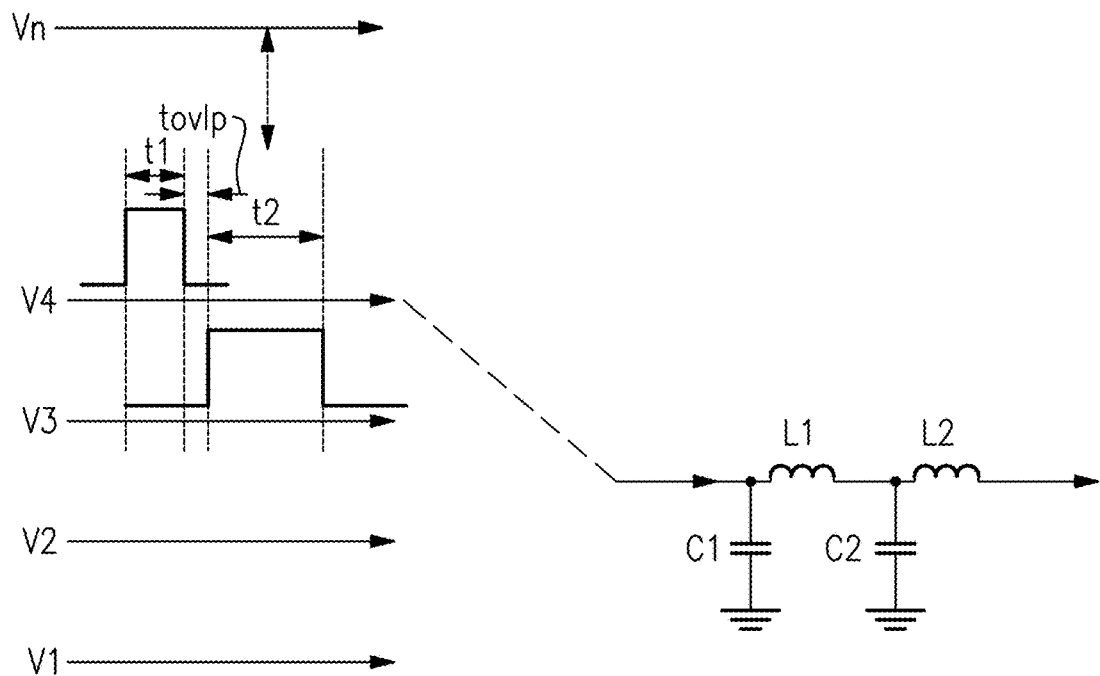
FIG. 11 is a schematic diagram of one example of timing for MLS DC-to-DC conversion.

FIG. 11 is a schematic diagram of one example of timing for MLS DC-to-DC conversion. As shown in FIG. 11, the width of regulation cycles can be used to control the voltage level of the regulated voltages generated by MLS DC-to-DC conversion. For instance, one MLS regulated voltage can be associated with a period t1, while a second regulation voltage can be associated with a different period t2. Additionally, a non-overlap period tovlp can be used to avoid crowbar currents between different voltage levels.

In certain implementations herein, one or more regulation periods (for instance, t1 and/or t2) and/or one or more non-overlap period (for instance, tovlp) are digitally controllable. In certain implementations, the delays are controlled based on a digital state machine and/or other suitable circuitry.

The regulated voltages generated by MLS DC-to-DC conversion can be selectively provided by a modulator to a modulator output filter. In the illustrated example, the modulator output filter is depicted as including shunt capacitors C1 and C2 and series inductors L1 and L2. However, other implementations of modulator output filters are possible.

Figure 12:
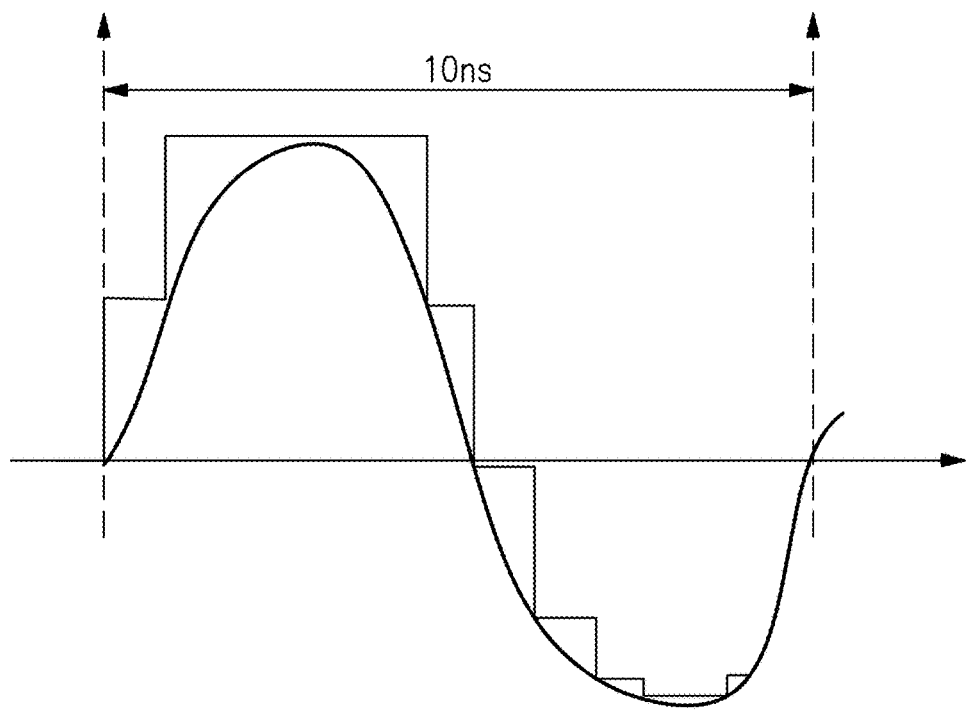
FIG. 12 is a schematic diagram of one example of MLS envelope tracking for a continuous wave signal.

FIG. 12 is a schematic diagram of one example of MLS envelope tracking for a continuous wave signal. The example shown is for a continuous wave signal having a frequency of about 100 MHz and a corresponding period of about 10 ns. Examples of suitable MLS voltage levels for the signal are shown.

CONCLUSION

Some of the embodiments described above have provided examples in connection with mobile devices. However, the principles and advantages of the embodiments can be used for any other systems or apparatus that have needs for envelope tracking.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "can," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. An envelope tracking system comprising:
a power amplifier configured to amplify a radio frequency signal and to receive power from a power amplifier supply voltage; and
an envelope tracker configured to generate the power amplifier supply voltage based on an envelope signal corresponding to an envelope of the radio frequency signal, the envelope tracker including a DC-to-DC converter configured to output a plurality of regulated voltages, a modulator configured to control the power amplifier supply voltage based on the plurality of regulated voltages and the envelope signal, and a switching point adaptation circuit configured to control a voltage level of at least one of the plurality of regulated voltages based on a power level of the radio frequency signal.

2. The envelope tracking system of claim 1 wherein the switching point adaptation circuit is configured to control the voltage level of each of the plurality of regulated voltages based on the power level of the radio frequency signal.

3. The envelope tracking system of claim 1 wherein the switching point adaptation circuit includes a power estimation circuit configured to estimate the power level of the radio frequency signal based on a signal power value for at least one of a transmit frame or a transmit symbol.

4. The envelope tracking system of claim 3 wherein the signal power value indicates an average power.

5. The envelope tracking system of claim 3 wherein the signal power value indicates a peak power.

6. The envelope tracking system of claim 3 wherein the switching point adaptation circuit further includes a voltage estimation circuit configured to estimate a plurality of desired voltage levels associated with the signal power value.

7. The envelope tracking system of claim 6 wherein the switching point adaptation circuit further includes a programming circuit configured to control the DC-to-DC converter to output the plurality of regulated voltages each with a corresponding one of the plurality of desired voltage levels.

8. The envelope tracking system of claim 1 comprising two or more power amplifiers configured to amplify two or more radio frequency signals, the envelope tracker including two or more modulators each configured to receive the plurality of regulated voltages and to provide modulation to generate a supply voltage for a corresponding one of the two or more power amplifiers.

9. The envelope tracking system of claim 8 wherein the switching point adaptation circuit is configured to control the voltage level based on a largest power level of the two or more radio frequency signals.

10. The envelope tracking system of claim 1 wherein each of the plurality of regulated voltages has a different voltage level.

11. The envelope tracking system of claim 1 wherein the modulator includes a plurality of switches each coupled between an output of the modulator and a corresponding one of the plurality of regulated voltages.

12. The envelope tracking system of claim 1 further comprising a modulator output filter connected between an output of the modulator and the power amplifier supply voltage, the modulator output filter includes at least one series inductor and at least one shunt capacitor.

13. A mobile device comprising:
a transceiver configured to generate a radio frequency transmit signal;
a front end circuit including a power amplifier configured to amplify the radio frequency transmit signal and to receive power from a power amplifier supply voltage; and
a power management circuit including an envelope tracker configured to generate the power amplifier supply voltage based on an envelope signal corresponding to an envelope of the radio frequency transmit signal, the envelope tracker including a DC-to-DC converter configured to output a plurality of regulated voltages, a modulator configured to control the power amplifier supply voltage based on the plurality of regulated voltages and the envelope signal, and a switching point adaptation circuit configured to control a voltage level of at least one of the plurality of regulated voltages based on a power level of the radio frequency transmit signal.

14. The mobile device of claim 13 wherein the switching point adaptation circuit includes a power estimation circuit configured to estimate the power level of the radio frequency transmit signal based on a signal power value for at least one of a transmit frame or a transmit symbol.

15. The mobile device of claim 14 wherein the switching point adaptation circuit further includes a voltage estimation circuit configured to estimate a plurality of desired voltage levels associated with the signal power value.

16. The mobile device of claim 15 wherein the switching point adaptation circuit further includes a programming circuit configured to control the DC-to-DC converter to output the plurality of regulated voltages each with a corresponding one of the plurality of desired voltage levels.

17. The mobile device of claim 13 comprising two or more power amplifiers configured to amplify two or more radio frequency transmit signals, the envelope tracker including two or more modulators each configured to receive the plurality of regulated voltages and to provide modulation to generate a supply voltage for a corresponding one of the two or more power amplifiers.

18. The mobile device of claim 17 wherein the switching point adaptation circuit is configured to control the voltage level based on a largest power level of the two or more radio frequency transmit signals.

19. A method of envelope tracking, the method comprising:
amplifying a radio frequency signal using a power amplifier;
supplying power to the power amplifier using a power amplifier supply voltage;
outputting a plurality of regulated voltages from a DC-to-DC converter;
controlling the power amplifier supply voltage based on the plurality of regulated voltages and an envelope signal using a modulator, the envelope signal corresponding to an envelope of the radio frequency signal; and
controlling a voltage level of at least one of the plurality of regulated voltages based on a power level of the radio frequency signal.

20. The method of claim 19 further comprising estimating the power level of the radio frequency signal based on a signal power value for at least one a transmit frame or a transmit symbol, and estimating a plurality of desired voltage levels associated with the signal power value.

* * * * *